United States Patent
Chamberlin et al.

(10) Patent No.: US 7,180,752 B2
(45) Date of Patent: Feb. 20, 2007

(54) METHOD AND STRUCTURES FOR IMPLEMENTING ENHANCED RELIABILITY FOR PRINTED CIRCUIT BOARD HIGH POWER DISSIPATION APPLICATIONS

(75) Inventors: Bruce John Chamberlin, Kirkwood, NY (US); Erica Elizabeth Jasper Gant, Austin, TX (US); Roger Scott Krabbenhoft, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 10/857,743

(22) Filed: May 28, 2004

(65) Prior Publication Data

US 2005/0265008 A1  Dec. 1, 2005

(51) Int. Cl.
*H01R 12/16* (2006.01)
(52) U.S. Cl. ............... 361/790; 361/767; 361/769; 257/686
(58) Field of Classification Search .......... 361/767, 361/769
See application file for complete search history.

(56) References Cited

U.S. PATENT DOCUMENTS

| | | | |
|---|---|---|---|
| 5,182,151 A * | 1/1993 | Furuta et al. .......... 428/36.92 |
| 5,574,630 A * | 11/1996 | Kresge et al. .......... 361/792 |
| 5,940,278 A * | 8/1999 | Schumacher .......... 361/769 |
| 6,239,485 B1 * | 5/2001 | Peters et al. .......... 257/700 |
| 6,351,391 B1 * | 2/2002 | Beliveau et al. .......... 361/767 |
| 6,365,975 B1 * | 4/2002 | DiStefano et al. .......... 257/777 |
| 6,699,046 B2 * | 3/2004 | Ho et al. .......... 439/70 |
| 6,717,821 B2 * | 4/2004 | Miller et al. .......... 361/760 |
| 6,750,551 B1 * | 6/2004 | Frutschy et al. .......... 257/785 |
| 6,778,404 B1 * | 8/2004 | Bolken et al. .......... 361/767 |
| 6,816,385 B1 * | 11/2004 | Alcoe .......... 361/767 |
| 2002/0041489 A1 * | 4/2002 | Fritz .......... 361/767 |
| 2003/0173111 A1 * | 9/2003 | Frutschy et al. .......... 174/260 |

* cited by examiner

*Primary Examiner*—Dean A. Reichard
*Assistant Examiner*—Hoa C. Nguyen
(74) *Attorney, Agent, or Firm*—Joan Pennington

(57) ABSTRACT

A method and structures are provided for implementing enhanced reliability for printed circuit board high power dissipation applications. An external return current member provides a return current path outside of the printed circuit board, thereby minimizing power dissipation within the printed circuit board. The external return current member can be implemented with an associated stiffener formed of electrically conductive material. Alternatively, the external return current member can be implemented with a sheet of electrically conductive material with an insulator provided between the sheet and the associated stiffener.

10 Claims, 2 Drawing Sheets

METHOD AND STRUCTURES FOR IMPLEMENTING ENHANCED RELIABILITY FOR PRINTED CIRCUIT BOARD HIGH POWER DISSIPATION APPLICATIONS

FIELD OF THE INVENTION

The present invention relates generally to the data processing field, and more particularly, relates to a method and structures for implementing enhanced reliability for printed circuit board high power dissipation applications.

DESCRIPTION OF THE RELATED ART

As used in the present specification and claims, the term printed circuit board or PCB means a substrate or multiple layers (multi-layer) of substrates used to electrically attach electrical components and should be understood to generally include circuit cards, printed circuit cards, printed wiring cards, and printed wiring boards.

As system performance requirements increase, the associated demand for higher performance processors results in a drastic increase in power consumption over a relatively short time period. For only one earlier generation, the power dissipation requirements of printed circuit boards were readily met with existing technologies.

Electrical interconnection between electrically conductive paths of patterned copper in the various layers of multi-layer boards typically is accomplished through vias. Vias often are formed by drilling holes and plating the paths through the holes forming the vias or plated through holes. The vias or plated through holes form electrical interconnections between intersected copper patterns in each of the printed circuit board layers.

Conventional or standard technology plated through holes (PTHs) could handle the thermal expansion requirements associated with the level of heat and power that must be dissipated in their proximity for earlier generations of processor applications.

However, current generation processor power requirements have demanded an exponential increase in the required power dissipation of the printed circuit board. With current generation processor power requirements, PTH reliability would be such that latent defects may appear in the field and customer environments.

A need exists for a mechanism for implementing enhanced reliability for printed circuit board high power dissipation applications.

SUMMARY OF THE INVENTION

Principal aspects of the present invention are to provide a method and structures for implementing enhanced reliability for printed circuit board high power dissipation applications. Other important aspects of the present invention are to provide such method and structures for implementing enhanced reliability for printed circuit board high power dissipation applications substantially without negative effect and that overcome many of the disadvantages of prior art arrangements.

In brief, a method and structures are provided for implementing enhanced reliability for printed circuit board high power dissipation applications. An electronic printed circuit board structure includes a printed circuit board including a plurality of electrical contact pads on a first surface and an opposite second surface. An electronic module has a bottom surface including a plurality of contact sites, some of which correspond to the pads on the printed circuit board. A first interposer is positioned between a top surface of the printed circuit board and a bottom surface of the module. The first interposer comprises a first interposer insulator and a plurality of compressible spring elements, each adapted to electrically connect one of a plurality of electrical contact pads of the printed circuit board to a respective one of the contact sites on the surface of the module. A second interposer is positioned between a bottom surface of the printed circuit board and an associated stiffener. The second interposer comprises a second interposer insulator and a plurality of compressible spring elements, each adapted to electrically connect one of a sub-plurality of return current electrical contact pads of the printed circuit board to an external return current member. The external return current member provides a return current path outside of the printed circuit board, thereby minimizing power dissipation within the printed circuit board.

In accordance with features of the invention, the external return current member can be implemented with the associated stiffener formed of electrically conductive material, such as by an associated metal stiffener. Alternatively, the external return current member can be implemented with a sheet of electrically conductive material with an insulator provided between the sheet and the associated stiffener.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method is provided to solve the issue of the massive power dissipation requirements using existing technologies in such a fashion so as to take power dissipation out of the printed circuit board where feasible. The method of the invention eliminates the necessity for the printed circuit board to carry the full current load, resulting in massive power dissipation.

Figure 1:
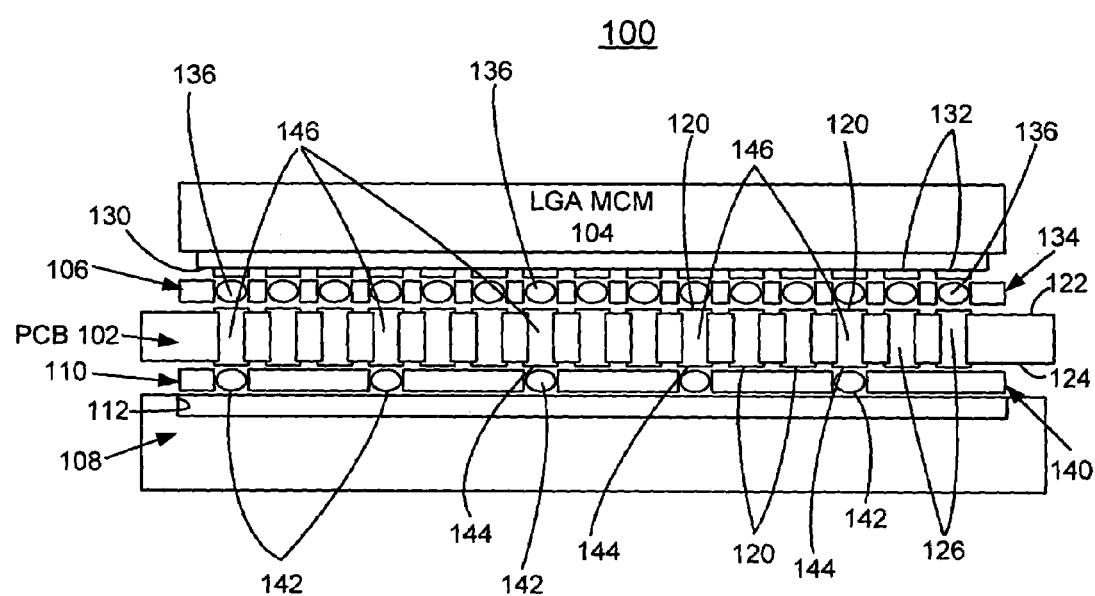
FIG. 1 is a plan view of an exemplary electronic printed circuit board structure in accordance with the preferred embodiment.

In accordance with features of the preferred embodiments, rather than have both the input and return current paths resident within the printed circuit board, the return current is allowed to flow through an external return current element, such as, through an associated metal stiffener, or through a simple laminated metal core feature embedded within the metal stiffener, for example, as illustrated and described with respect to FIG. 1. Also the external return current element or member can be implemented with a sheet of electrically conductive material with an insulator provided between the sheet and the associated stiffener, for example, as illustrated and described with respect to FIG. 2. By allowing the return current to flow outside of the main printed circuit board itself, the amount of power dissipated is substantially reduced, thus reducing the potential for latent failure of various features within the printed circuit board, such as failure of a plated through hole (PTH).

Having reference now to the drawings, in FIG. 1, there is shown an exemplary electronic printed circuit board structure in accordance with the preferred embodiment generally designated by the reference character 100. The electronic printed circuit board structure 100 comprises a printed circuit board 102 typically including multiple patterned conductive layers interleaved with layers of high dielectric material (these various layers not being shown) in the form of a laminate. On one side of the printed circuit board 102 is an electrical module 104, such as a Land Grid Array (LGA) multi-chip module (MCM). A first interposer 106 separates the module 104 from the printed circuit board 102. On the opposite side of the printed circuit board 102 is a stiffener 108. A second interposer 110 separating the stiffener 108 from the printed circuit board 102 is received within a stiffener cavity 112.

The printed circuit board 102 includes a plurality of electrical contact pads 120 on a first surface 122 and an opposite second surface 124. As shown, a plurality of plated through holes (PTHs) or vias 126 are formed between aligned pads 120.

A bottom surface 130 of the electronic module 104 includes a plurality of contact sites 132, some of which correspond to the pads 120 on the first surface 122 of the printed circuit board 102. The first interposer 106 is positioned between the first surface 122 of the printed circuit board 102 and the bottom surface 130 of the module 104. The first interposer 106 includes a first interposer insulator 134 and a plurality of compressible spring elements 136. Each compressible spring element 136 is adapted to electrically connect one of a plurality of electrical contact pads 120 of the printed circuit board 102 to a respective one of the contact sites 132 on the bottom surface 130 of the module 104.

In accordance with features of the preferred embodiments, the second interposer 110 is positioned between a bottom surface 124 of the printed circuit board 102 and the associated stiffener 108. The second interposer 110 comprises a second interposer insulator 140 and a plurality of compressible spring elements 142. Each compressible spring element 142 is adapted to electrically connect one of a sub-plurality of return current electrical contact pads 144 of the printed circuit board to an external return current member defined by the stiffener 108. The external return current member 108 provides a return current path outside of the printed circuit board 102, thereby minimizing power dissipation within the printed circuit board.

The second interposer 110 can replace a conventional LGA insulator, on the back to the LGA site. The second interposer 110 can be implemented with a conventional LGA interposer that is depopulated with all buttons or compressible spring elements removed except for the plurality of resilient conductive contact buttons or compressible spring elements 142 under return current electrical contact pads 144. At least some of the return current electrical contact pads 144 are connected to a corresponding predefined ground PTHs 146. The compressible spring elements 142 are arranged to short all of the ground PTHs 146 in the LGA site to the associated stiffener 108. The stiffener 108 typically is tied to logic ground and is arranged to handle the increased current of this return current path of the preferred embodiment.

In accordance with features of the preferred embodiment, an advantage of using the stiffener 108 for an external return current path is that all of the ground planes that otherwise would be required can be removed from the printed circuit board 102, except for the signal references.

Figure 2:
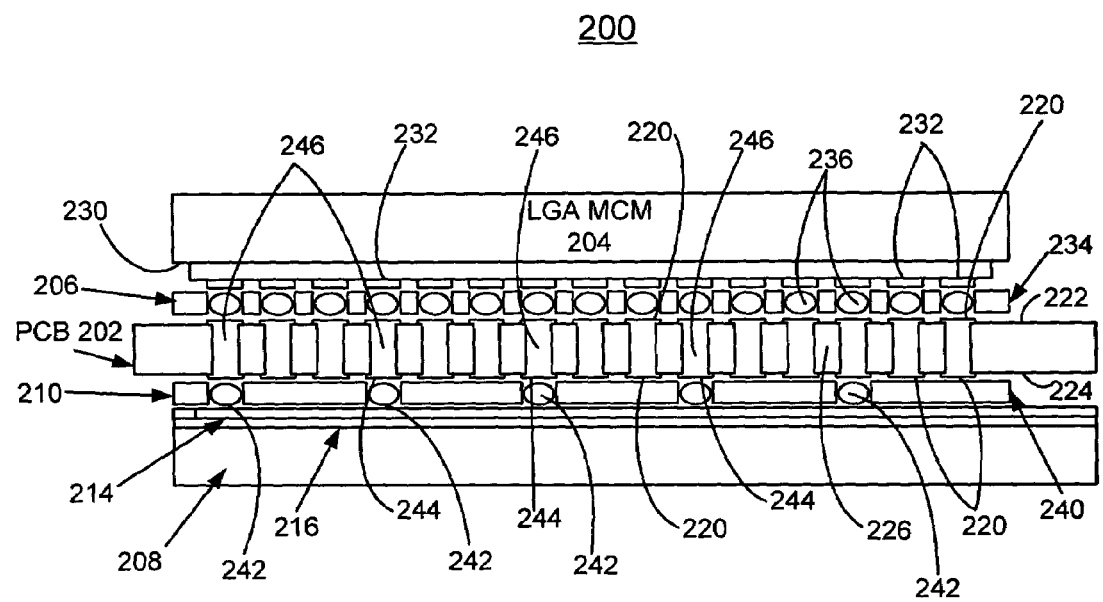
FIG. 2 is a plan view of an alternative exemplary electronic printed circuit board structure in accordance with the preferred embodiment.

Referring now to FIG. 2 there is shown another exemplary electronic printed circuit board structure in accordance with the preferred embodiment generally designated by the reference character 200. Electronic printed circuit board structure 200 can be operated at a selected or variable voltage rail VCC other than logic ground, for example, at 2.5 volts or 1.8 volts.

Electronic printed circuit board structure 200 comprises a printed circuit board 202 and on one side of the printed circuit board 202 is an electrical module 204, such as a Land Grid Array (LGA) multi-chip module (MCM). A first interposer 206 separates the module 204 from the printed circuit board 202. On the opposite side of the printed circuit board 202 is a stiffener 208. A second interposer 210 separates the stiffener 208 from the printed circuit board 202.

In accordance with features of the preferred embodiments, an external return current member 214 together with an aligned insulating member 216 is positioned between the second interposer 210 and the stiffener 208. The external return current member 214 can be implemented, for example, by a sheet of copper that extends between the MCM site under module 204 and a compliant pin area of the printed circuit board 202. The external return current member 214 eliminates the need to run current through the stiffener 208. With the insulator 216 between the external return current member 214 and the stiffener 208, allows other voltage levels to be used.

The printed circuit board 202 includes a plurality of electrical contact pads 220 on a first surface 222 and an opposite second surface 224. As shown, a plurality of plated through holes (PTHs) or vias 226 are formed between aligned pads 220.

A bottom surface 230 of the electronic module 204 includes a plurality of contact sites 232, some of which correspond to the pads 220 on the first surface 222 of the printed circuit board 202. The first interposer 206 is positioned between the first surface 222 of the printed circuit board 202 and the bottom surface 230 of the module 204. The first interposer 206 includes a first interposer insulator 234 and a plurality of compressible spring elements 236. Each compressible spring element 236 is adapted to electrically connect one of a plurality of electrical contact pads 220 of the printed circuit board 202 to a respective one of the contact sites 232 on the bottom surface 230 of the module 204.

In accordance with features of the preferred embodiments, the second interposer 220 is positioned between a bottom surface 224 of the printed circuit board 202 and the external return current member 214 above the associated stiffener 208. The second interposer 220 comprises a second interposer insulator 240 and a plurality of compressible spring elements 242. Each compressible spring element 242 is adapted to electrically connect one of a sub-plurality of return current electrical contact pads 244 of the printed circuit board to the external return current member 214. The external return current member 214 provides the return current path outside of the printed circuit board 202, thereby minimizing power dissipation within the printed circuit board.

In accordance with features of the preferred embodiment, an advantage of using the external return current member 214 for an external return current path is that all of the ground planes that otherwise would be required can be removed from the printed circuit board 202, except for the signal references.

It should be understood that the invention is not limited to the illustrated embodiments of FIGS. 1 and 2. For example, one method of connecting to logic ground could be implemented with the second interposer 110, 210 as shown in FIGS. 1 and 2 positioned in a compliant pin connector area of the printed circuit board.

While the present invention has been described with reference to the details of the embodiments of the invention shown in the drawing, these details are not intended to limit the scope of the invention as claimed in the appended claims.

What is claimed is:

1. An electronic printed circuit board structure for implementing enhanced reliability for printed circuit board high power dissipation applications, said electronic printed circuit board structure comprising: a printed circuit board including a plurality of electrical contact pads on a first surface and an opposite second surface; an electronic module including a bottom surface; said bottom surface including a plurality of contact sites, some of said plurality of contact sites correspond to the pads on said first surface of the printed circuit board; an associated stiffener; said associated stiffener including a stiffener cavity; a first interposer positioned between said first surface of the printed circuit board and said bottom surface of the module; said first interposer comprising a first interposer insulator and a plurality of electrically conductive elements, each said electrically conductive element adapted to electrically connect one of a plurality of electrical contact pads of the printed circuit board to a respective one of the contact sites on the surface of the module; a second interposer positioned between said opposite second surface of the printed circuit board and said associated stiffener; said second interposer comprises a second interposer insulator and a plurality of electrically conductive elements, each of said plurality of electrically conductive elements adapted to electrically connect one of a sub-plurality of return current electrical contact pads of the printed circuit board to an external return current member; and said external return current member providing a return current path outside of the printed circuit board, thereby minimizing power dissipation within the printed circuit board.

2. An electronic printed circuit board structure as recited in claim 1 wherein said external return current member comprises said associated stiffener; said associated stiffener being formed of electrically conductive material.

3. An electronic printed circuit board structure as recited in claim 1 wherein said external return current member comprises a sheet of electrically conductive material received within said stiffener cavity and an insulator is provided between said sheet and said associated stiffener.

4. An electronic printed circuit board structure as recited in claim 1 wherein said external return current member comprises a metal plate defining said associated stiffener.

5. An electronic printed circuit board structure as recited in claim 1 wherein at least some of said return current electrical contact pads of the printed circuit board are connected to plated through holes in the printed circuit board.

6. An electronic printed circuit board structure for implementing enhanced reliability for printed circuit board high power dissipation applications, said electronic printed circuit board structure comprising:

a printed circuit board including a plurality of electrical contact pads on a first surface and an opposite second surface;

an electronic module including a bottom surface; said bottom surface including a plurality of contact sites, some of said plurality of contact sites correspond to the pads on said first surface of the printed circuit board;

an associated stiffener spaced apart from said opposite second surface of the printed circuit board;

a first interposer positioned between said first surface of the printed circuit board and said bottom surface of the module; said first interposer comprising a first interposer insulator and a plurality of compressible spring elements, each compressible spring element adapted to electrically connect one of a plurality of electrical contact pads of the printed circuit board to a respective one of the contact sites on the surface of the module;

a second interposer positioned between said opposite second surface of the printed circuit board and said associated stiffener; said second interposer received within a stiffener cavity defined by said associated stiffener; said second interposer comprises a second interposer insulator and a plurality of compressible spring elements, each of said plurality of compressible spring elements adapted to electrically connect one of a sub-plurality of return current electrical contact pads of the printed circuit board to an external return current member; said external return current member providing a return current path outside of the printed circuit board, thereby minimizing power dissipation within the printed circuit board.

7. An electronic printed circuit board structure as recited in claim 6 wherein said external return current member comprises said associated stiffener; said associated stiffener being formed of electrically conductive material.

8. An electronic printed circuit board structure as recited in claim 6 wherein said external return current member comprises a sheet of electrically conductive material and an insulator is provided between said sheet and said associated stiffener.

9. An electronic printed circuit board structure as recited in claim 6 wherein said external return current member comprises a metal plate defining said associated stiffener.

10. An electronic printed circuit board structure as recited in claim 6 wherein at least some of said return current electrical contact pads of the printed circuit board are connected to plated through holes in the printed circuit board.

* * * * *